(12) United States Patent
Shin et al.

(10) Patent No.: US 9,978,781 B2
(45) Date of Patent: May 22, 2018

(54) DISPLAY DEVICE

(71) Applicant: SAMSUNG DISPLAY CO., LTD., Yongin-si, Gyeonggi-do (KR)

(72) Inventors: Hey Jin Shin, Cheonan-si (KR); Won Kyu Kwak, Seongnam-si (KR); Seung-Kyu Lee, Asan-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days. days.

(21) Appl. No.: 15/465,862

(22) Filed: Mar. 22, 2017

(65) Prior Publication Data

US 2018/0053792 A1 Feb. 22, 2018

(30) Foreign Application Priority Data

Aug. 22, 2016 (KR) .......................... 10-2016-0106298

(51) Int. Cl.
*H01L 29/49* (2006.01)
*H01L 27/12* (2006.01)

(52) U.S. Cl.
CPC ................................ *H01L 27/1244* (2013.01)

(58) Field of Classification Search
CPC .................................................. H01L 27/1244
See application file for complete search history.

(56) References Cited

U.S. PATENT DOCUMENTS 9,349,758 B2 * 5/2016 Ki ...................... H01L 29/78672
9,720,545 B2 * 8/2017 Yu ......................... G06F 3/0418

FOREIGN PATENT DOCUMENTS

| JP | 2013-011663 | 1/2013 |
| KR | 1020070082867 | 8/2007 |
| KR | 1020130136806 | 12/2013 |
| KR | 1020160060237 | 5/2016 |

* cited by examiner

*Primary Examiner* — Michael Shingleton
(74) *Attorney, Agent, or Firm* — F. Chau & Associates, LLC

(57) ABSTRACT

A display device including: a substrate including a display area for displaying an image and a non-display area positioned at a periphery of the display area; a plurality of pixels positioned at the display area; a plurality of data lines connected with the plurality of pixels; and a crack detecting line positioned at the non-display area, wherein the crack detecting line includes: a plurality of unit connectors extending in a first direction, wherein the first direction is parallel to an extending direction of a side of the substrate nearest to the unit connectors; and a plurality of wiring portion units connected to each other through the plurality of unit connectors, wherein the number of wiring portion units is an even number.

19 Claims, 10 Drawing Sheets

DISPLAY DEVICE

CROSS-REFERENCE TO RELATED APPLICATION

This application claims priority under 35 U.S.C. § 119 to Korean Patent Application No. 10-2016-0106298 filed on Aug. 22, 2016 in the Korean Intellectual Property Office, the disclosure of which is incorporated by reference herein in its entirety.

TECHNICAL FIELD

The present invention relates to a display device, and more particularly, to detecting a crack in the display device.

DISCUSSION OF THE RELATED ART

Currently, display devices may change from a flat form to a flexible form.

In a manufacturing process of the display device, if a crack is generated, moisture or other foreign particles may enter a display area of the display device. The moisture or other foreign particles may cause a defect in the display device.

SUMMARY OF THE INVENTION

According to an exemplary embodiment of the present invention, there is provided a display device comprising: a substrate comprising a display area for displaying an image and a non-display area positioned at a periphery of the display area; a plurality of pixels positioned at the display area; a plurality of data lines connected with the plurality of pixels; and a crack detecting line positioned at the non-display area, wherein the crack detecting line comprises: a plurality of unit connectors extending in a first direction, wherein the first direction is parallel to an extending direction of a side of the substrate nearest to the unit connectors; and a plurality of wiring portion units connected to each other through the plurality of unit connectors, wherein the number of wiring portion units is an even number.

The plurality of wiring portion units comprise a plurality of return wiring portions connected to each other, and the plurality of return wiring portions comprise a plurality of bridge portions extending in the first direction.

The plurality of return wiring portions comprise a plurality of connecting portions connecting the plurality of bridge portions, wherein the connecting portions are shorter than the plurality of bridge portions.

The crack detecting line is connected with a first data line among the plurality of data lines.

The crack detecting line is connected with the first data line through a first connector and a second connector, and the first data line is connected with the plurality of pixels between a portion of the crack detecting line connected with the first connector and a portion of the crack detecting line connected with the second connector.

The crack detecting line surrounds the display area.

A first interval between the plurality of return wiring portions is larger than a second interval between the plurality of wiring portion units.

The plurality of bridge portions have a same length as each other.

The first interval between the plurality of return wiring portions is substantially constant.

Each of the plurality of wiring portion units comprises an equal number of return wiring portion units.

At least one of the plurality of bridge portions has a bent shape along a corner of the substrate.

According to an exemplary embodiment of the present invention, there is provided a display device comprising: a substrate comprising a display area for displaying an image and a non-display area positioned at a periphery of the display area; a plurality of pixels positioned at the display area; a plurality of data lines connected with the plurality of pixels; and a crack detecting line positioned at the non-display area, wherein the crack detecting line comprises: a plurality of bridge portions extending in a direction not parallel to a first direction, wherein the first direction is parallel to an extending direction of a side of the substrate that is nearest to the bridge portions; and a plurality of return wiring portions comprising a plurality of connecting portions connecting the plurality of bridge portions.

The crack detecting line is connected with a first data line among the plurality of data lines.

The plurality of connecting portions are shorter than the plurality of bridge portions.

The crack detecting line is connected with the first data line through a first connector and a second connector, and the first data line is connected with the plurality of pixels between a portion of the crack detecting line connected with the first connector and a portion of the crack detecting line connected with the second connector.

The crack detecting line surrounds the display area.

The plurality of bridge portions have a same length as each other.

The first interval between the plurality of return wiring portions is substantially constant.

The plurality of bridge portions extend in a direction forming an angle of about 90 degrees or about 45 degrees with the first direction.

BRIEF DESCRIPTION OF THE DRAWINGS

The above and other features of the present invention will become more apparent by describing in detail exemplary embodiments thereof, with reference to the accompanying drawings, in which.

DETAILED DESCRIPTION OF THE EMBODIMENTS

Figure 1:
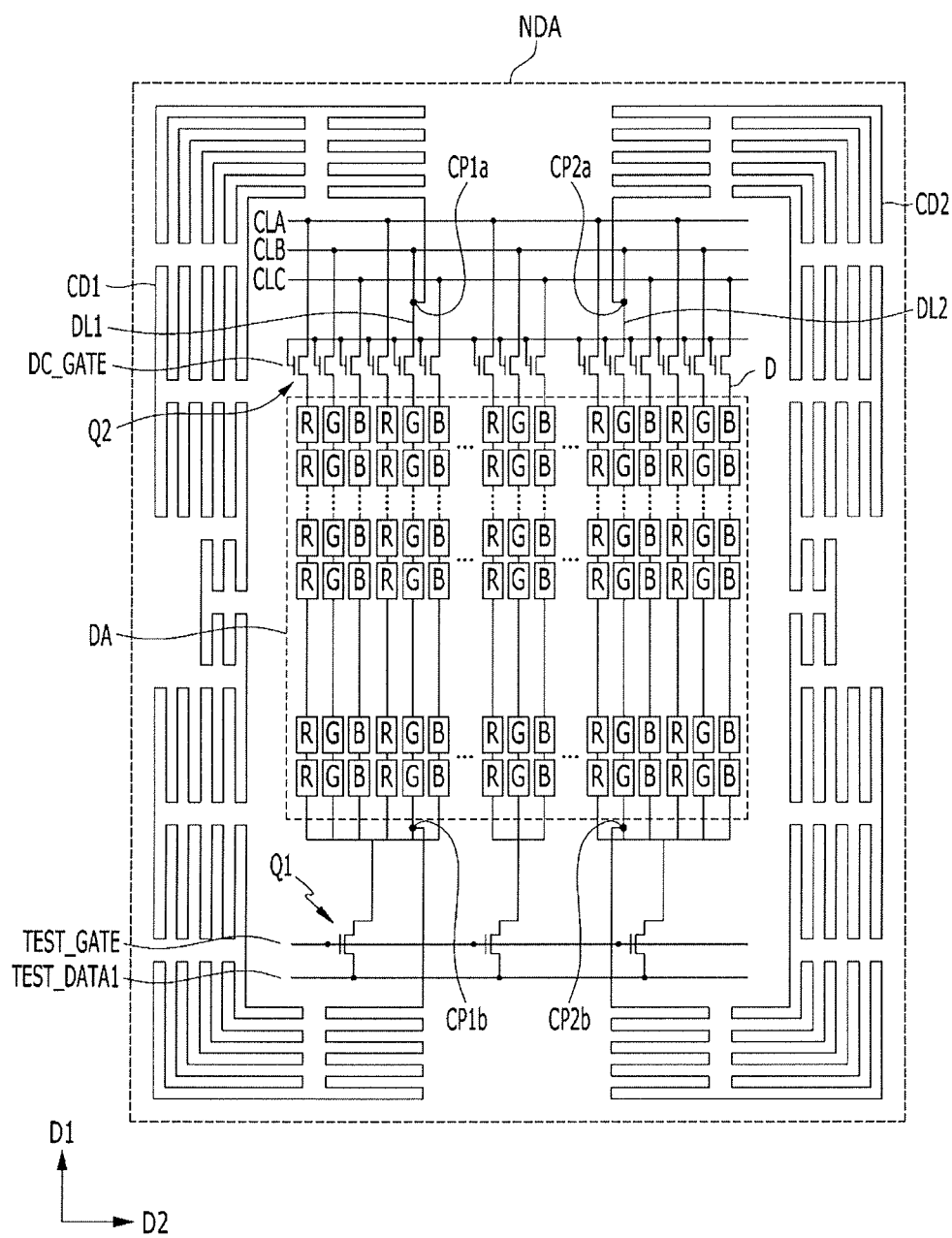
FIG. 1 is a circuit diagram of a display device according to an exemplary embodiment of the present invention.

Exemplary embodiments of the present invention will be described more fully hereinafter with reference to the accompanying drawings. It is to be understood, however, that the described embodiments may be modified in various different ways, all without departing from the spirit and scope of the present invention.

Like reference numerals may designate like elements throughout the present disclosure.

Furthermore, the size and thickness of each component illustrated in the drawings may be exaggerated for better understanding and ease of description, but the present inventive concept is not limited to the drawings.

It will be understood that when an element such as a layer, film, region, or substrate is referred to as being "on" another element, it may be directly on the other element or intervening elements may also be present.

Figure 2:
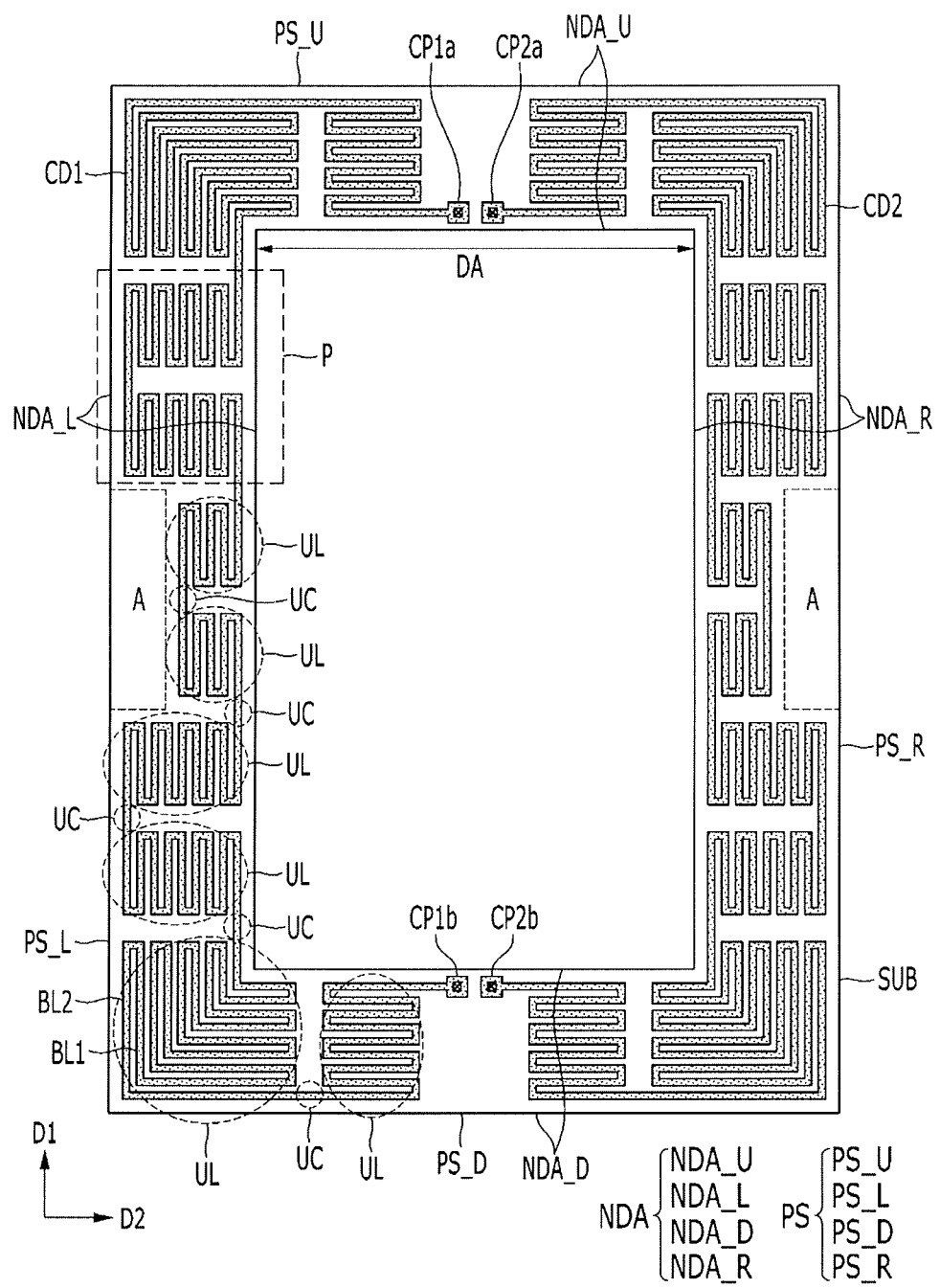
FIG. 2 is a schematic plan view illustrating an arrangement of a crack detecting line in a display device according to an exemplary embodiment of the present invention.
Figure 3:
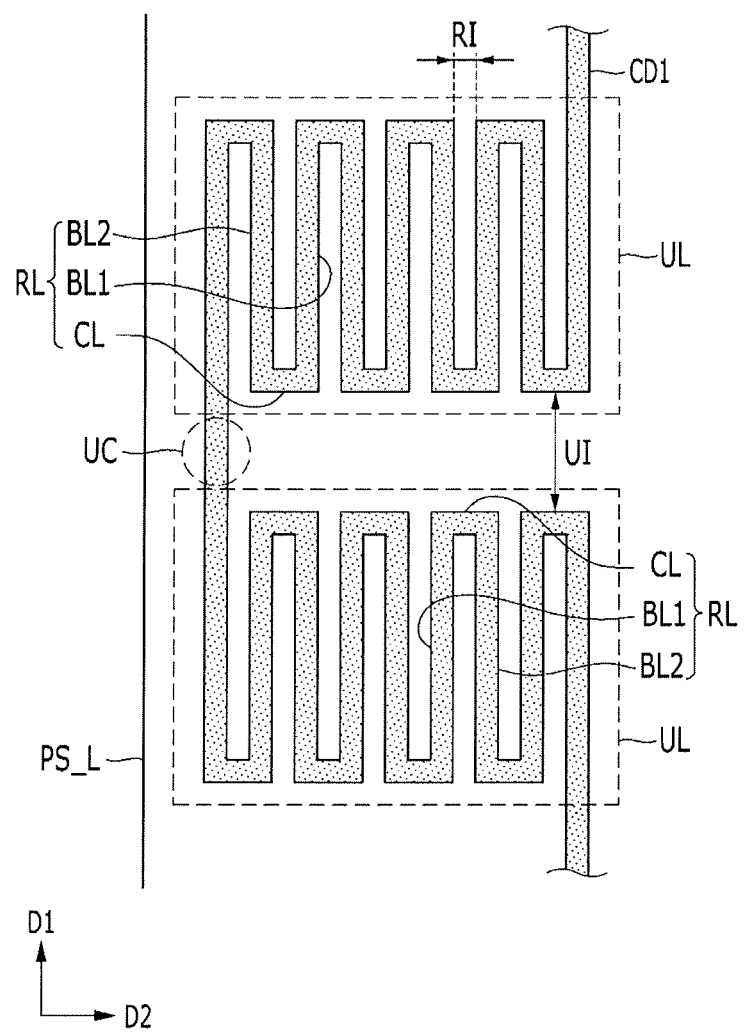
FIG. 3 is an enlarged view of an area P of FIG. 2.

First, a display device according to an exemplary embodiment of the present invention will be described reference to FIG. 1 to FIG. 3. FIG. 1 is a circuit diagram of a display device according to an exemplary embodiment of the present invention, and FIG. 2 is a schematic plan view illustrating an arrangement of a crack detecting line in a display device according to an exemplary embodiment of the present invention. FIG. 3 is an enlarged view of an area P of FIG. 2.

The display device according to an exemplary embodiment of the present invention is formed on a substrate SUB, and the substrate SUB includes a display area DA including a plurality of pixels R, G, and B, and a non-display area NDA surrounding the display area DA. The display area DA is an area for displaying an image, and the non-display area NDA is an area in which diodes and/or wires for generating and/or transporting various signals applied to the display area DA are disposed.

The substrate SUB of the display device according to the present exemplary embodiment may be an insulation substrate that may include, for example, glass, a polymer, and the like, or may be a metallic substrate that may include, for example, stainless steel and the like. The substrate SUB may be flexible, stretchable, foldable, bendable, or rollable. For example, the substrate SUB may be provided as a flexible film type that may include a resin such as a polyimide.

The display area DA of the substrate SUB includes a plurality of pixels R, G, and B. The pixel is a minimum unit for displaying an image, for example.

The display device according to the present exemplary embodiment includes a plurality of signal lines connected with the plurality of pixels R, G, and B. At least some of the plurality of signal lines may be positioned in the non-display area NDA of the substrate SUB.

The plurality of signal lines may include a first test gate line TEST_GATE, a second test gate line DC_GATE, a plurality of data lines D, a first test signal line TEST_DATA1, a plurality of second test signal lines CLA, CLB, and CLC, a first crack detecting line CD1, and a second crack detecting line CD2.

A first switch Q1 may be positioned in the non-display area NDA of the substrate SUB. The control terminal of the first switch Q1 may be connected with the first test gate line TEST_GATE, and an input terminal of the first switch Q1 may be connected with the first test signal line TEST_DATA1. An output terminal of the first switch Q1 may be connected with the data line D. The output terminal of the first switch Q1 may be connected with a plurality of data lines D.

A second switch Q2 may be positioned in the non-display area NDA of the substrate SUB. The control terminal of the second switch Q2 may be connected with the second test gate line DC_GATE, and an input terminal may be connected with a second test signal line CLA, CLB, or CLC. An output terminal of the second switch Q2 may be connected with the data line D. For example, a first pixel R among a plurality of pixels R, G, and B may be connected with a first-second test signal line CLA through the second switch Q2. A second pixel G may be connected with a second-second test signal line CLB through the second switch Q2, and a third pixel B may be connected with a third-second test signal line CLC through the second switch Q2.

The first crack detecting line CD1 and the second crack detecting line CD2 may be positioned in the non-display area NDA. The first crack detecting line CD1 and the second crack detecting line CD2 may be positioned on the same layer as a gate line of the display area DA, and may include the same material as the gate line. In addition, the first crack detecting line CD1 and the second crack detecting line CD2 may be positioned on the same layer as the data line D of the display area DA, and may include the same material as the data line D.

The first crack detecting line CD1 and the second crack detecting line CD2 may surround the display area DA. The first crack detecting line CD1 and the second crack detecting line CD2 may be positioned in an area between a boundary of the display area DA and a side PS of the substrate SUB. In other words, the first crack detecting line CD1 and the second crack detecting line CD2 may be positioned in the non-display area NDA. As the first crack detecting line CD1 and the second crack detecting line CD2 occupy more of the non-display area NDA, the area in which a crack may be detected may be broadened. However, the first crack detecting line CD1 and the second crack detecting line CD2 may be positioned in an area separated from the plurality of signal lines such as the first test gate line TEST_GATE, the second test gate line DC_GATE, the first test signal line TEST_DATA1, and the plurality of second test signal lines CLA, CLB, and CLC in the non-display area NDA. In addition, there may be two first areas A positioned on the substrate SUB. Further, at least one of the first areas A may include constituent elements other than crack detecting lines CD1 and CD2, such as an alignment mark, and/or may be positioned in the non-display area NDA of the substrate SUB. In addition, the first crack detecting line CD1 and the second crack detecting line CD2 may also be positioned to avoid the first area A. In FIG. 2, the first areas A may be positioned on a left non-display area NDA_L and/or a right non-display area NDA_R of the substrate SUB, but are not limited thereto. For example, the first areas A may be positioned so that they are facing each other. The first areas A may be positioned on another portion of the substrate SUB according to a design of the display device, and may be positioned in one or more portions of the substrate SUB. Hereafter, throughout the specification, the terms "left", "right", "upper", and "lower" indicate convenient references of positions shown in drawings, but do not mean absolute positions, and other positions can be "left", "right", "upper", and "lower" according to an exemplary embodiment of the present invention in practice.

The first crack detecting line CD1 is connected with at least one of the plurality of data lines D through a first connector CP1a and a second connector CP1b. The first crack detecting line CD1 is connected with the first data line DL1 among the plurality of data lines D, and the first data line DL1 is connected with the plurality of pixels positioned between the connection of the first data line DL1 and the first connector CP1a and the connection of the first data line DL1 and the second connector CP1b. The first crack detecting line CD1 may be connected with the first data line DL1 through the first connector CP1a in an upper non-display area NDA_U of the substrate SUB, and the first crack detecting line CD1 may be connected with first data line DL1 through the second connector CP1*b* in a lower non-display area NDA_D of the substrate SUB. The first crack detecting line CD1 extends from the first connector CP1*a* connected to the first data line DL1, passes through the left non-display area NDA_L, extends in the lower non-display area NDA_D, and is connected with first data line DL1 through the second connector CP1*b*.

The first data line DL1 connected with the first crack detecting line CD1 may be connected with the second-second test signal line CLB. One end of the first crack detecting line CD1 may be connected with the input terminal of the second switch Q2 through the first connector CP1*a*.

The first crack detecting line CD1 may include an even number of a plurality of wiring portion units UL. The plurality of wiring portion units UL may be connected to one another through a plurality of unit connectors UC.

Each of the wiring portion units UL includes a plurality of return wiring portions RL (e.g., shown in FIG. 3). Each return wiring portion RL may include a first bridge portion BL1, a second bridge portion BL2, and a connecting portion CL connecting the first bridge portion BL1 and the second bridge portion BL2. The first bridge portion BL1 and the second bridge portion BL2 may extend in a first direction D1. For example, the first bridge portion BL1 and the second bridge portion BL2 may extend in a direction that is parallel to a direction of an adjacent side PS among a plurality of sides of the substrate SUB. The first bridge portion BL1 and second bridge portion BL2 positioned in the left non-display area NDA_L of the substrate SUB extend in a first direction D1 parallel to aa left side PS_L of the substrate SUB. The connecting portion CL connecting the first bridge portion BL1 and the second bridge portion BL2 extending in the first direction D1 may extend in a second direction D2 perpendicular to the first direction D1. In addition, the first bridge portion BL1 and the second bridge portion BL2 positioned in the upper non-display area NDA_U of the substrate SUB may extend in the second direction D2 parallel to an upper side PS_U of the substrate SUB. The connecting portion CL connecting the first bridge portion BL1 and the second bridge portion BL2 extending in the second direction D2 may extend in a first direction D1 perpendicular to the second direction D2.

The connecting portion CL is shorter than the first bridge portion BL1 and the second bridge portion BL2. Each wiring portion unit UL includes a plurality of return wiring portions RL, which are each disposed side by side and connected with one another. The first bridge portion BL1 and the second bridge portion BL2 may be substantially a same length as each other, and the plurality of first bridge portions BL1 and the plurality of second bridge portions BL2 included in one wiring portion unit UL may be substantially a same length as one another. Further, a first interval RI, which is an interval between return wiring portions RL among the plurality of return wiring portions RL, may be smaller than a second interval UI, which is an interval between the wiring portion units UL.

The plurality of wiring portion units UL are connected with one another through the plurality of unit connectors UC. The unit connector UC has a shape of a straight line, which is not bent, and connects two wiring portion units UL. The plurality of unit connectors UC extends in a direction that is parallel to a nearest side PS among a plurality of sides of the substrate SUB. For example, the unit connector UC positioned in the left non-display area NDA_L of the substrate SUB extends in the first direction D1 which extends parallel to a left side PS_L of the substrate SUB. Further, the unit connector UC may extend in a direction that is parallel to a direction in which the plurality of first bridge portions BL1 and the plurality of second bridge portions BL2, which are included in wiring portion units UL connected by the unit connector UC, extend.

The number of return wiring portions RL included in each wiring portion unit UL may be different. The number of return wiring portions RL may decrease around the first area A, in which constituent elements other than crack detecting lines, such as an alignment mark, may be positioned. For example, the number of return wiring portions RL included in the wiring portion unit UL positioned to the right (e.g., along the second direction D2) of the first area A may be smaller than the number of return wiring portions RL included in the first wiring portion unit UL not positioned to the right of the first area A. In other words, the wiring portion units UL positioned between the first area A and the display area DA have less return wiring portions RL than that of the wiring portion units UL positioned in other areas of the non-display area NDA.

The plurality of first bridge portions BL1 and the plurality of second bridge portions BL2 may have a bent shape along a corner of the substrate SUB.

The plurality of wiring portion units UL of the first crack detecting line CD1 may extend from the upper non-display area NDA_U of the substrate SUB, may extend through the left non-display area NDA_L of the substrate SUB, and may be disposed in the lower non-display area NDA_D of the substrate SUB. For example, the plurality of wiring portion units UL of the first crack detecting line CD1 may be disposed to surround the left circumference of the display area DA.

The second crack detecting line CD2 is connected with at least one of the plurality of data lines D through a third connector CP2*a* or a fourth connector CP2*b*. The second crack detecting line CD2 is connected with the second data line DL2 among the plurality of data lines D, and the second data line DL2 is connected with the plurality of pixels positioned between a the connection of the second data line DL2 and the third connector CP2*a* and the connection of the second data line DL2 and the fourth connector CP2*b*. The second crack detecting line CD2 may be connected with the second data line DL2 through the third connector CP2*a* in the upper non-display area NDA_U of the substrate SUB, and the second crack detecting line CD2 may be connected with the second data line DL2 through the fourth connector CP2*b* in the lower non-display area NDA_D of the substrate SUB. The second crack detecting line CD2 extends from the third connector CP2*a* connected to the second data line DL2, passes through the right non-display area NDA_R, extends in the lower non-display area NDA_D, and is connected with the second data line DL2 at the fourth connector CP2*b*.

The second data line DL2 connected with the second crack detecting line CD2 may be connected with the second-second test signal line CLB. One end of the second crack detecting line CD2 may be connected with the input terminal of the second switch Q2 through the third connector CP2*a*.

The second crack detecting line CD2 may include an even number of a plurality of wiring portion units UL, like the first crack detecting line CD1, and the plurality of wiring portion units UL may be connected to one another through the plurality of unit connector UC having a shape of a straight line. Each of the wiring portion units UL includes the plurality of return wiring portions RL. Each the return wiring portions RL may include the first bridge portion BL1, the second bridge portion BL2, and the connecting portion CL connecting the first bridge portion BL1 and the second bridge portion BL2. Further, a first interval RI, which is an interval between return wiring portions RL among the plurality of return wiring portions RL, may be smaller than a second interval UI, which is an interval between the wiring portion units UL.

In addition, the disposition shape of the second crack detecting line CD2 is symmetrical with the disposition shape of the first crack detecting line CD1. The plurality of wiring portion units UL of the second crack detecting line CD2 may extend from the upper non-display area NDA_U portion of the substrate SUB, may extend through the right non-display area NDA_R of the substrate SUB, and may be disposed in the lower non-display area NDA_D of the substrate SUB. For example, the plurality of wiring portion units UL of the second crack detecting line CD2 may be disposed to surround the right circumference of the display area DA.

While an exemplary embodiment of the present invention has been described above, the scope of the present invention is not limited thereto. For example, the present invention is intended to cover various modifications and equivalent arrangements. For example, in FIG. 2, the non-display area NDA may be disposed to surround the display area DA, but the non-display area NDA may be disposed to partially surround the display area DA. For example, the NDA may surround part of the peripheral region. For example, as shown in FIG. 2, when the display area DA has a shape of a quadrangle, the non-display area NDA may be positioned near at least one side of the four sides of the display area DA. Further, the first crack detecting line CD1 and/or the second crack detecting line CD2 may be positioned in at least a portion of the non-display area NDA.

Further, the first crack detecting line CD1 and the second crack detecting line CD2 might not be formed separately, but the first crack detecting line CD1 or the second crack detecting line CD2 may be positioned to surround the entire display area DA. In this case, the first crack detecting line CD1 may extend from the first connector CP1a connected with the data line D at the upper non-display area NDA_U of the substrate SUB, extend through the left non-display area NDA_L of the substrate SUB, the lower non-display area NDA_D of the substrate SUB, and the right non-display area NDA_R of the substrate SUB to surround the display area DA, and may return to the upper non-display area NDA_U of the substrate SUB to be connected with the data line D through the second connector CP1b. In an exemplary embodiment of the present invention, the second connector CP1b may be positioned in the upper non-display area NDA_U when the first crack detecting line CD1 or the second crack detecting line CD2 surround the entire display area DA.

Further, the display device according to an exemplary embodiment of the present invention may include more than two crack detecting lines CD1 and CD2.

In addition, the present invention may be applied to various display devices such as a liquid crystal display (LCD) device, an organic light emitting display (OLED) device, and so on.

Further, when the display device of the present invention includes a sealing portion to seal the display area DA and cover the substrate SUB with the plurality of pixels R, G, and B interposed therebetween. Further, the first crack detecting line CD1 and the second crack detecting line CD2 may be positioned in a portion of the non-display area NDA of the substrate SUB in which the sealing portion might not positioned. For example, the first crack detecting line CD1 and the second crack detecting line CD2 may be positioned outside of the sealing portion and in the non-display area NDA.

Figure 4:
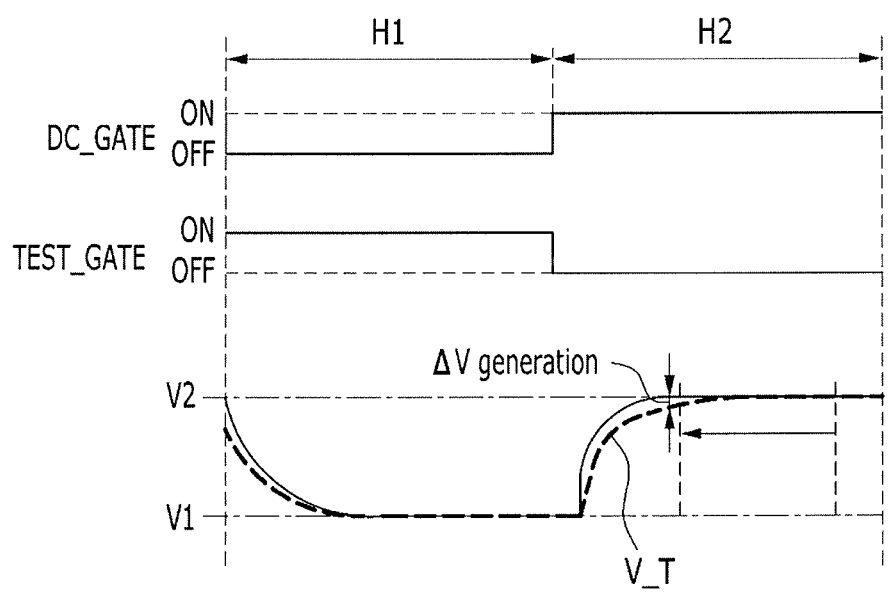
FIG. 4 is a waveform diagram of a signal of a display device according to an exemplary embodiment of the present invention.

Hereafter, the operation of the display device according to an exemplary embodiment of the present invention will be described with reference to FIG. 1. and FIG. 4. FIG. 4 is a waveform diagram of a signal of a display device according to an exemplary embodiment of the present invention.

When a gate ON signal is applied to the first test gate line TEST_GATE during a first time H1, the plurality of first switches Q1 connected with the plurality of data lines D are turned on, and thus, a first signal V1 applied to the first test signal line TEST_DATA1 is applied to the plurality of data lines D. For example, the first signal V1 may be a signal to make the plurality of pixels R, G, and B produce a white color, and the first signal V1 is applied to the plurality of data lines D such that the plurality of pixels R, G, and B may produce the white color.

When the gate ON signal is applied to the second test gate line DC_GATE during a second time H2, which is also when a gate OFF signal is applied to the first test gate line TEST_GATE, the second switch Q2 connected with the plurality of data lines D is turned on, and thus, a second signal V2 applied to the plurality of second test signal lines CLA, CLB, and CLC is applied to the plurality of data lines D. For example, the second signal V2 may be a signal to make the plurality of pixels R, G, and B produce a black color, and the second signal V2 is applied to the plurality of data lines D such that the plurality of pixels R, G, and B produce the black color.

In this case, if the crack is generated in the non-display area NDA positioned at a peripheral region of the display area DA by applying an external impact to the display device, the first crack detecting line CD1 or the second crack detecting line CD2 may be damaged.

Accordingly, a resistance of the first data line DL1 or the second data line DL2 connected with the first crack detecting line CD1 or the second crack detecting line CD2 is increased, and thus, a voltage V_T applied to the pixel connected with the first crack detecting line CD1 or the second crack detecting line CD2 cannot be charged to the second signal V2, and a voltage difference ΔV between the second signal V2 and the voltage V_T is generated.

By generating the voltage difference ΔV, the pixel connected with the first crack detecting line CD1 or the second crack detecting line CD2 cannot produce the black color, and the pixel may produce a relatively brighter color. Accordingly, the crack which may be generated in the non-display area NDA adjacent to the edge of the display area DA may be detectable.

Figure 5:
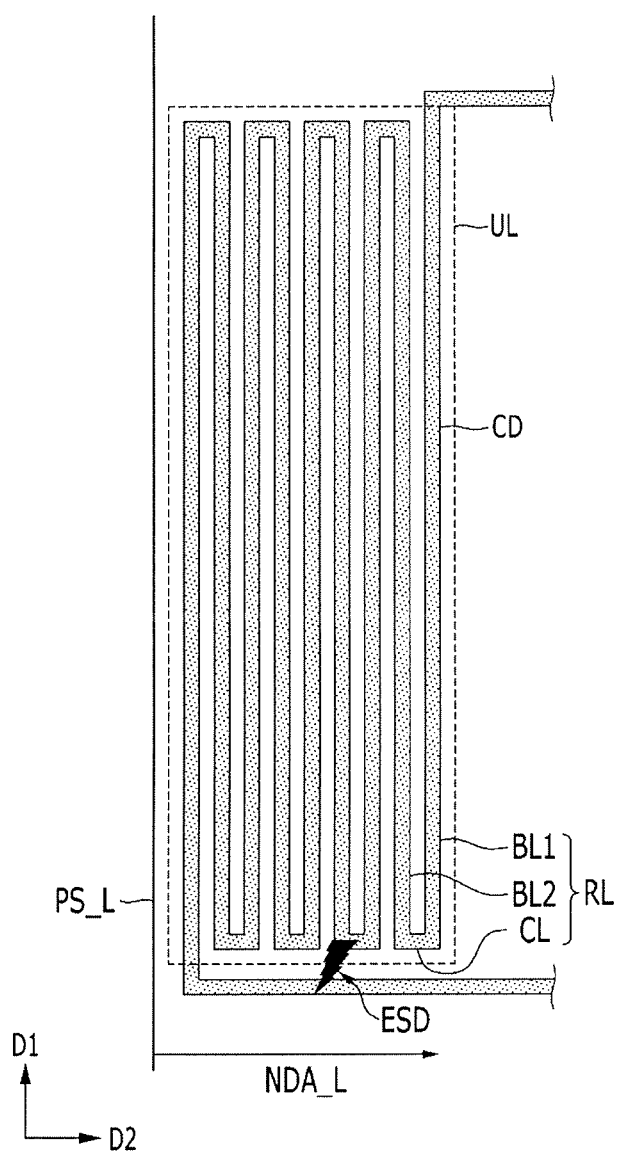
FIG. 5 and FIG. 6 are each schematic views showing a crack detecting line of a display device according to a comparative example.
Figure 6:
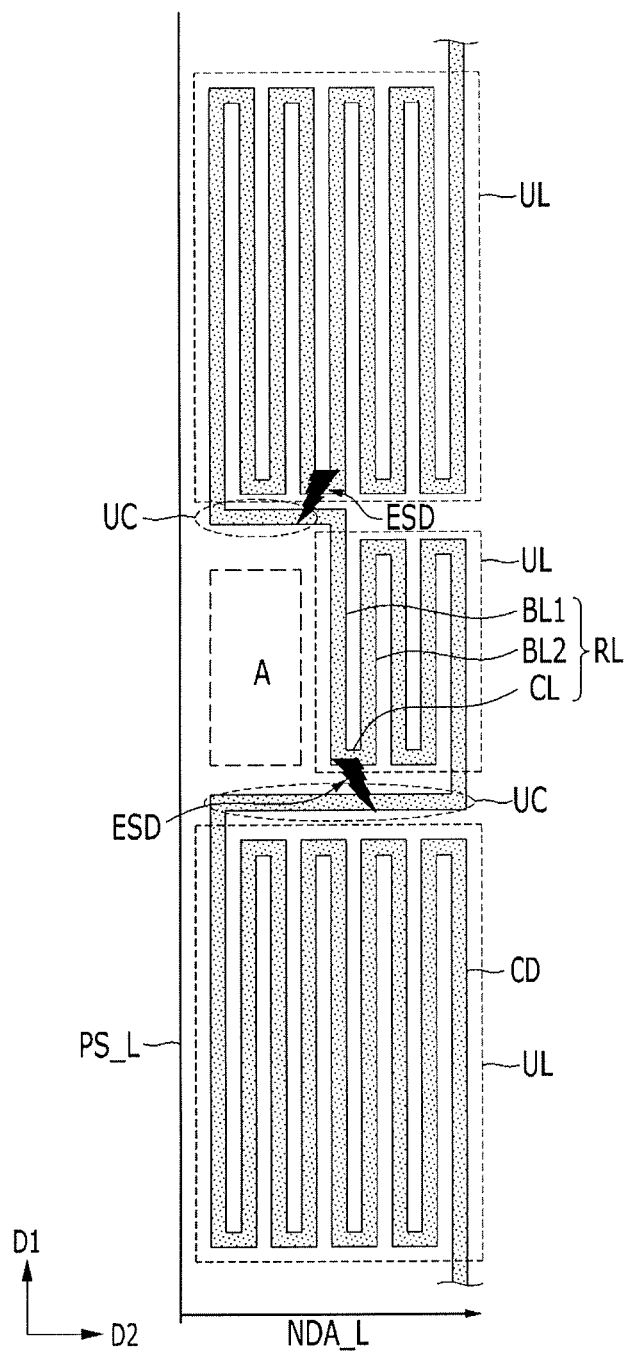

Hereafter, the effect of the display device according to an exemplary embodiment of the present invention will be described with reference to FIG. 2, FIG. 3, FIG. 5, and FIG. 6 and compared to a comparative example. FIG. 5 and FIG. 6 are schematic views showing a crack detecting line CD of a display device according to the comparative example.

Referring to FIG. 2 and FIG. 3, when the first crack detecting line CD1 is formed to include a plurality of wiring portion units UL, as shown in FIG. 2, an electrostatic discharge ESD due to a potential difference may be reduced compared to a case when there is one wiring portion unit UL so that the return wiring portion RL returns when in the left non-display area NDA_L of the substrate SUB in one arrangement of the crack detecting lines (e.g., CD1 and CD2). For example, when the first crack detecting line CD1 is made of one wiring portion unit UL, the length of the first bridge portion BL1 becomes longer by the one side PS of the substrate SUB, and thus, the potential difference between both ends of the first bridge portion BL1 may be increased. By disposing return wiring portions RL having this potential difference side by side, the potential difference may be progressively generated in the first crack detecting line CD1. Since there is the potential difference in the return wiring portions RL adjacent to each other at the first crack detecting line CD1, the electrostatic discharge ESD may be generated between the adjacent portions of the return wiring portions RL (e.g., first bridge portion BL1, second bridge portion BL2, and connecting portion CL). If the electrostatic discharge ESD is generated, a burnt phenomenon in which the perimeter of the portion generating the electrostatic discharge ESD is burned black may be generated, and the accuracy of the crack detection by the crack detecting line may be reduced. However, as shown in FIG. 2 and FIG. 3, when the first crack detecting line CD1 is formed to include a plurality of wiring portion units UL, the length of the first bridge portion BL1 is shorter than when the first crack detecting line CD1 is made of one wiring portion unit UL, so that the potential difference between both ends of the first bridge portion BL1 may be reduced. Accordingly, the potential difference in portions of the return wiring portion RL that are adjacent to each other at the first crack detecting line CD1 may be reduced, and thus, the electrostatic discharge ESD may be reduced between the adjacent portions of the return wiring portion RL. When the second crack detecting line CD2 is formed to include a plurality of wiring portion units UL, the effect is essentially the same as when the first crack detecting line CD1 has a plurality of wiring portion units UL.

Further, as the unit connector UC connected between the wiring portion units UL is formed to have a shape of the straight line, the electrostatic discharge between the unit connector UC and the wiring portion unit UL adjacent to the unit connector UC may be reduced. When the unit connector UC is bent and is positioned across the wiring portion unit UL, the potential difference may be generated between the unit connector UC and the wiring portion unit UL adjacent to the unit connector UC so that the electrostatic discharge may be generated. For example, when the unit connector UC extends parallel to the connecting portions CL of the wiring portion unit UL, the potential difference may be generated. However, when the unit connector UC is formed to have a shape of the straight line, and not formed across the wiring portion unit UL, the generation of the electrostatic discharge between the unit connector UC and the wiring portion unit UL adjacent to the unit connector UC may be prevented. When the number of wiring portion units UL is an even number, the unit connector UC may be formed to have a shape of the straight line without a bent portion, and the second interval UI between the wiring portion units UL may be larger than the first interval RI between the return wiring portions RL, so that the electrostatic discharge between the wiring portion units UL may be further reduced. Accordingly, the reliability of the crack detecting line and the display device may be increased.

Next, the comparative example will be described with reference to FIG. 5 and FIG. 6. FIG. 5 shows an arrangement of the crack detecting line CD positioned at the left non-display area NDA_L of the substrate SUB. The crack detecting line CD of the comparative example includes one wiring portion unit UL. The wiring portion unit UL includes a plurality of first bridge portions BL1 and a plurality of second bridge portions BL2 extending in the first direction D1 parallel to the left side PS_L of the substrate SUB. As shown in FIG. 5, when the crack detecting line CD is made of one wiring portion unit UL such that one of the return wiring portions RL returns when at the left non-display area NDA_L of the substrate SUB, the length of the first bridge portion BL1 may become longer by the left side PS_L of the substrate SUB. Accordingly, the potential difference between both ends of the first bridge portion BL1 may be increased. By disposing return wiring portions RL having this potential difference side by side, the potential difference may be progressively generated in the crack detecting line CD. Due to the potential difference in the crack detecting line CD, as shown in FIG. 5, the electrostatic discharge ESD may be generated between the adjacent portions of the wiring portion unit UL. If the electrostatic discharge ESD is generated, a burnt phenomenon, in which the perimeter of the portion generated the electrostatic discharge ESD is burned black may be generated, and the accuracy of crack detection by the crack detecting line CD may be reduced. The position of the electrostatic discharge ESD shown in FIG. 5 is merely an example, and the electrostatic discharge can be generated in a position of the crack detecting line CD other than the position shown in FIG. 5 as long as the potential difference is generated.

FIG. 6 shows an arrangement of the crack detecting line CD positioned at the left non-display area NDA_L of the substrate SUB. The number of wiring portion units UL of the comparative example is an odd number. The wiring portion units UL include a plurality of the first bridge portions BL1 and a plurality of the second bridge portions BL2 which respectively extend in the first direction D1 parallel to the left side PS_L of the substrate SUB, but the unit connector UC connecting the wiring portion units UL has a bent shape, and is positioned across the wiring portion units UL. For example, the unit connector may be positioned to extend parallel to connection portions CL of the wiring portion unit UL. As shown in FIG. 6, the unit connector UC is bent and is positioned across the wiring portion unit UL, and the potential difference is generated between the unit connector UC and the wiring portion unit UL adjacent to the unit connector UC so that the electrostatic discharge ESD is generated. Accordingly, a burnt phenomenon, in which the perimeter of the portion generated the electrostatic discharge ESD is burned black may be generated, and the crack detecting effect of the crack detecting line may be reduced. The position of the electrostatic discharge ESD shown in FIG. 6 is merely an example, and the electrostatic discharge ESD may be generated in a position of the crack detecting line CD other than the position shown in FIG. 6 as long as the potential difference is generated.

Figure 7:
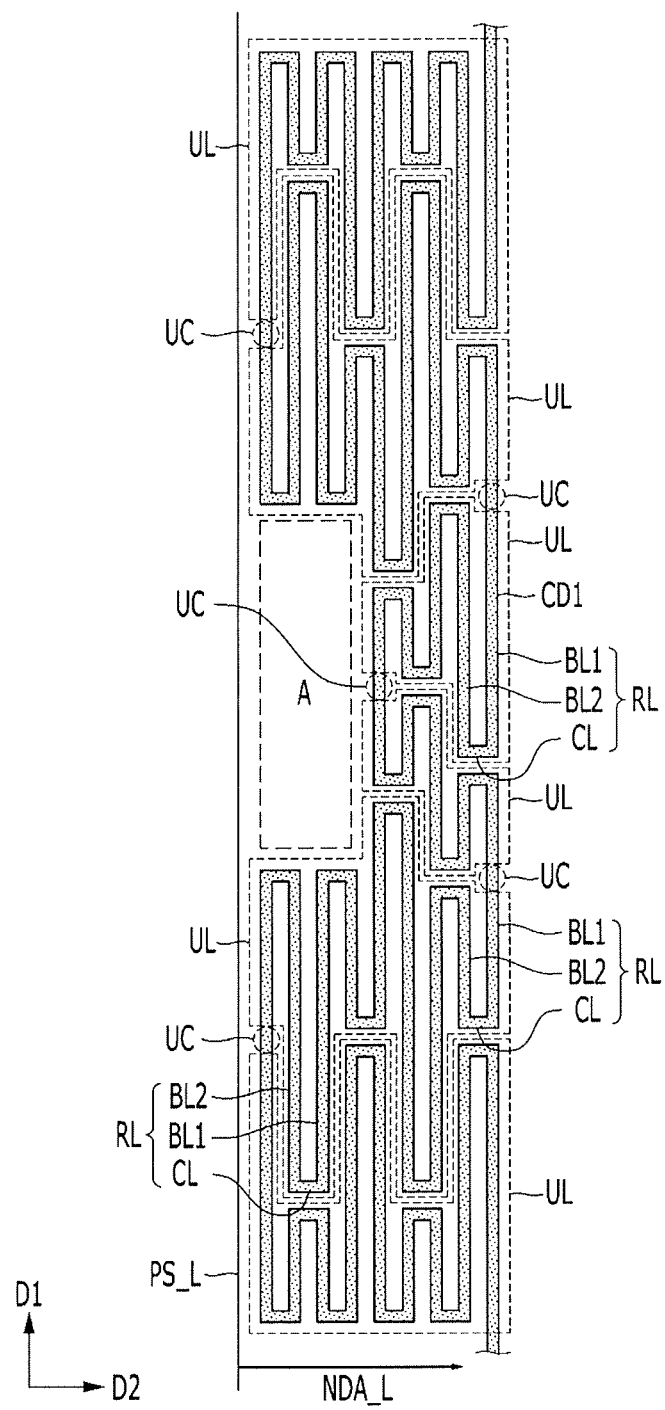
FIG. 7, FIG. 8, FIG. 9, and FIG. 10 are each schematic views showing a crack detecting line of a display device according to an exemplary embodiment of the present invention.
Figure 8:
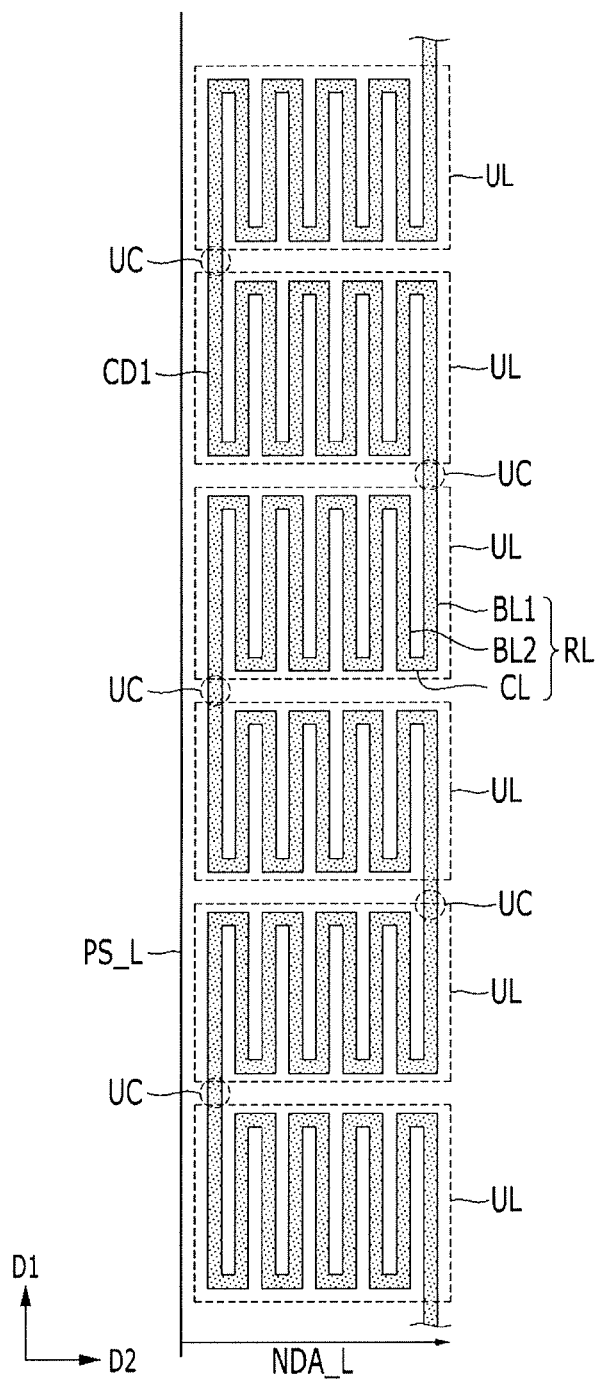

Hereafter, the crack detecting line CD1 of the display device according to an exemplary embodiment of the present invention will be described with reference to FIG. 7 and FIG. 8. FIG. 7 and FIG. 8 are schematic views respectively showing a crack detecting line CD1 of a display device according to an exemplary embodiment of the present invention. Portions of the present exemplary embodiment that are similar to portions in the previous exemplary embodiments described above may be omitted.

FIG. 7 shows an arrangement of the first crack detecting line CD1 positioned at the left non-display area NDA_L of the substrate SUB. The first crack detecting line CD1 includes an even number of wiring portion units UL. The plurality of wiring portion units UL are connected to each other through the unit connector UC which has a straight line shape and extends in the first direction D1 parallel to an extending direction of a nearest left side PS_L among a plurality of sides of the substrate SUB. Each of the wiring portion units UL includes a plurality of return wiring portions RL. The return wiring portions RL include a plurality of first bridge portions BL1, a plurality of second bridge portions BL2, and a plurality of connecting portions CL connecting the first bridge portions BL1 and the second bridge portions BL2 to each other. The first bridge portion BL1 and the second bridge portion BL2 extend in the first direction D1 parallel to an extending direction of a nearest left side PS_L among a plurality of sides of the substrate SUB. The connecting portion CL extends in the second direction D2 perpendicular to the first bridge portion BL1 and the second bridge portion BL2. The connecting portion CL is shorter than the first bridge portion BL1 and the second bridge portion BL2. The lengths of the return wiring portions RL adjacent to each other may be different. Further, the lengths of the return wiring portions RL facing each other may be different. The lengths of the first bridge portion BL1 and the second bridge portion BL2 in one return wiring portion RL may be different.

FIG. 8 shows an arrangement of the first crack detecting line CD1 positioned at the left non-display area NDA_L of the substrate SUB. FIG. 8 shows an arrangement of the first crack detecting line CD1 when the non-display area does not include an area in which constituent elements other than crack detecting lines, such as an alignment mark or other wires, are positioned. The first crack detecting line CD1 includes an even number of wiring portion units UL. The plurality of wiring portion units UL are connected to each other through the unit connector UC which has a straight line shape and extends in the first direction D1 parallel to an extending direction of a nearest left side PS_L among a plurality of sides of the substrate SUB. The plurality of first bridge portions BL1 and the plurality of second bridge portions BL2 extend in the first direction parallel to an extending direction of a nearest left side PS_L among a plurality of sides of the substrate SUB, and the plurality of first bridge portions BL1 and the plurality of second bridge portions BL2 may all have the same length. For example, the plurality of first bridge portions BL1 and the plurality of second bridge portions BL2 may have the same length, since there is no area to be avoided.

Figure 9:
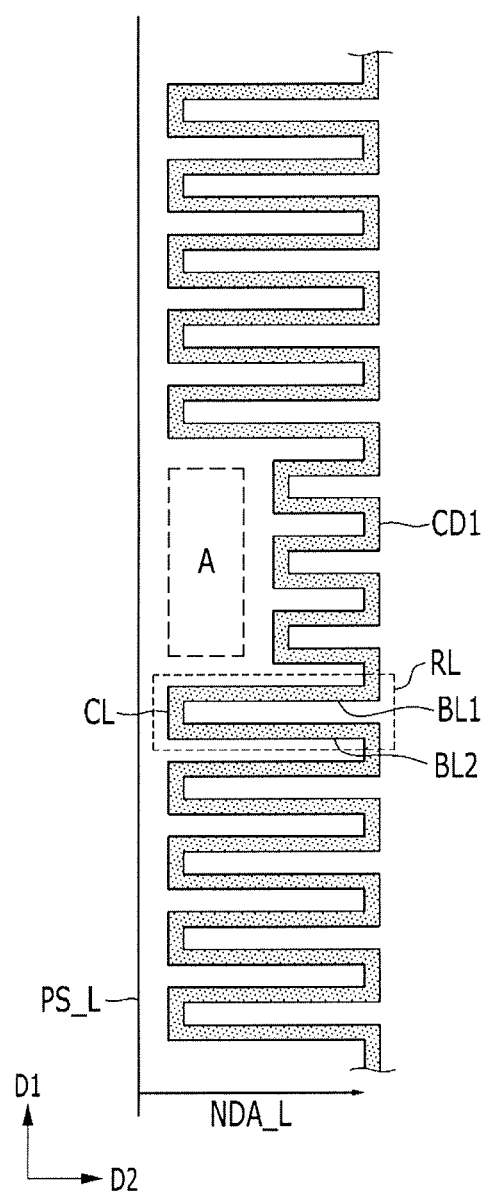
Figure 10:
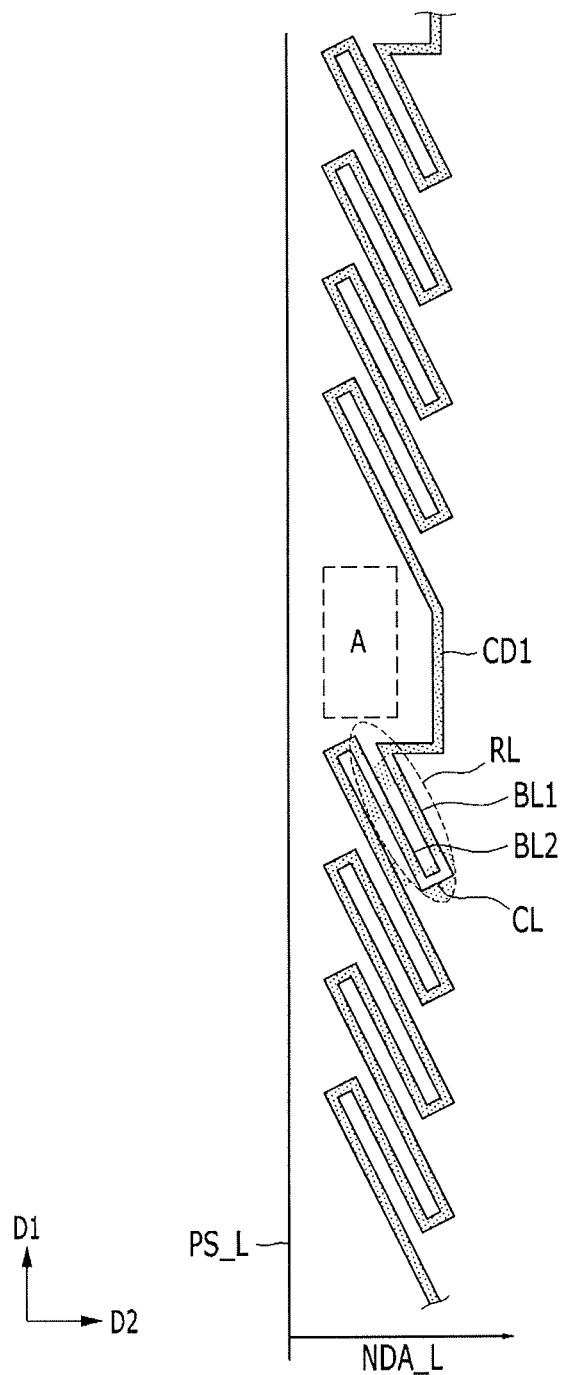

Hereafter, the crack detecting line of the display device according to an exemplary embodiment of the present invention will be described with reference to FIG. 9 and FIG. 10. FIG. 9 and FIG. 10 are schematic views respectively showing a crack detecting line of a display device according to an exemplary embodiment. Portions of the present exemplary embodiment that are similar to portions in the previous exemplary embodiments described above may be omitted.

FIG. 9 shows an arrangement of the first crack detecting line CD1 positioned at the left non-display area NDA_L of the substrate SUB. The first crack detecting line CD1 includes a plurality of return wiring portions RL. The return wiring portions RL include the first bridge portion BL1, the second bridge portion BL2, and the connecting portion CL connecting the first bridge portion BL1 and the second bridge portion BL2 to each other. The first bridge portion BL1 and the second bridge portion BL2 extend in the second direction D2 perpendicular to the first direction D1 parallel to an extending direction of a nearest left side PS_L among a plurality of sides of the substrate SUB. The connecting portion CL extends in the first direction D1 perpendicular to the first bridge portion BL1 and the second bridge portion BL2. The lengths of the first bridge portion BL1 and the second bridge portion BL2 may be same. The connecting portion CL is shorter than the first bridge portion BL1 and the second bridge portion BL2. When the first bridge portion BL1 and the second bridge portion BL2 extend in the direction perpendicular to the first direction D1 parallel to an extending direction of a nearest left side PS_L among a plurality of sides of the substrate SUB, the plurality of return wiring portions RL having a same shape may be repeatedly positioned. At the first area A in which constituent elements other than crack detecting lines, such as an alignment mark, are positioned, the lengths of the first bridge portion BL1 and the second bridge portion BL2 may be decreased. The plurality of return wiring portions RL may be positioned at regular intervals.

FIG. 10 shows an arrangement of the first crack detecting line CD1 positioned at the left non-display area NDA_L of the substrate SUB. The first crack detecting line CD1 includes a plurality of return wiring portions RL. The return wiring portions RL include the first bridge portion BL1, the second bridge portion BL2, and the connecting portion CL connecting the first bridge portion BL1 and the second bridge portion BL2 to each other. The first bridge portion BL1 and the second bridge portion BL2 extend in a direction forming an angle of about 90 degrees or about 45 degrees with the first direction D1 parallel to an extending direction of a nearest left side PS_L among a plurality of sides of the substrate SUB. The connecting portion CL extends in a direction perpendicular to the first bridge portion BL1 and the second bridge portion BL2. The lengths of the first bridge portion BL1 and the second bridge portion BL2 may be same. The connecting portion CL is shorter than the first bridge portion BL1 and the second bridge portion BL2. When the first bridge portion BL1 and the second bridge portion BL2 extend in a direction forming an angle of about 90 degrees or about 45 degrees with the first direction D1 parallel to an extending direction of a nearest left side PS_L among a plurality of sides of the substrate SUB, the plurality of return wiring portions RL having a same shape may be repeatedly positioned. The return wiring portions RL may not be positioned at the first area A in which constituent elements other than crack detecting lines, such as an alignment mark, are positioned. The plurality of return wiring portions RL may be positioned at regular intervals.

According to an exemplary embodiment of the present invention, by detecting the crack of the display device, defects in the display device caused by the crack may be reduced.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:
1. A display device, comprising:
a substrate comprising a display area for displaying an image and a non-display area positioned at a periphery of the display area;
a plurality of pixels positioned at the display area;
a plurality of data lines connected with the plurality of pixels; and
a crack detecting line positioned at the non-display area, wherein the crack detecting line comprises:
a plurality of unit connectors extending in a first direction, wherein the first direction is parallel to an extending direction of a side of the substrate nearest to the unit connectors; and
a plurality of wiring portion units connected to each other through the plurality of unit connectors, wherein the number of wiring portion units is an even number.

2. The display device of claim 1, wherein
the plurality of wiring portion units comprise a plurality of return wiring portions connected to each other, and
the plurality of return wiring portions comprise a plurality of bridge portions extending in the first direction.

3. The display device of claim 2, wherein
the plurality of return wiring portions comprise a plurality of connecting portions connecting the plurality of bridge portions, wherein the connecting portions are shorter than the plurality of bridge portions.

4. The display device of claim 3, wherein
the crack detecting line is connected with a first data line among the plurality of data lines.

5. The display device of claim 4, wherein
the crack detecting line is connected with the first data line through a first connector and a second connector, and
the first data line is connected with the plurality of pixels between a portion of the crack detecting line connected with the first connector and a portion of the crack detecting line connected with the second connector.

6. The display device of claim 4, wherein
the crack detecting line surrounds the display area.

7. The display device of claim 4, wherein
a second interval between the plurality of wiring portion units is larger than a first interval between the plurality of return wiring portions.

8. The display device of claim 4, wherein
the plurality of bridge portions have a same length as each other.

9. The display device of claim 4, wherein
a first interval between the plurality of return wiring portions is substantially constant.

10. The display device of claim 4, wherein
each of the plurality of wiring portion units comprises an equal number of return wiring portion units.

11. The display device of claim 4, wherein
at least one of the plurality of bridge portions has a bent shape along a corner of the substrate.

12. A display device, comprising:
a substrate comprising a display area for displaying an image and a non-display area positioned at a periphery of the display area;
a plurality of pixels positioned at the display area;
a plurality of data lines connected with the plurality of pixels; and
a crack detecting line positioned at the non-display area,
wherein the crack detecting line comprises:
a plurality of bridge portions extending in a direction not parallel to a first direction, wherein the first direction is parallel to an extending direction of a side of the substrate that is nearest to the bridge portions; and
a plurality of return wiring portions comprising a plurality of connecting portions connecting the plurality of bridge portions.

13. The display device of claim 12, wherein
the crack detecting line is connected with a first data line among the plurality of data lines.

14. The display device of claim 13, wherein
the plurality of connecting portions are shorter than the plurality of bridge portions.

15. The display device of claim 14, wherein
the crack detecting line is connected with the first data line through a first connector and a second connector, and
the first data line is connected with the plurality of pixels between a portion of the crack detecting line connected with the first connector and a portion of the crack detecting line connected with the second connector.

16. The display device of claim 14, wherein
the crack detecting line surrounds the display area.

17. The display device of claim 14, wherein
the plurality of bridge portions have a same length as each other.

18. The display device of claim 14, wherein
a first interval between the plurality of return wiring portions is substantially constant.

19. The display device of claim 14, wherein
the plurality of bridge portions extend in a direction forming an angle of about 90 degrees or about 45 degrees with the first direction.

\* \* \* \* \*